United States Patent
Shibata

(10) Patent No.: US 8,847,221 B2
(45) Date of Patent: Sep. 30, 2014

(54) STACKED SEMICONDUCTOR DEVICE AND METHOD OF TESTING THE SAME

(75) Inventor: Kayoko Shibata, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 1499 days.

(21) Appl. No.: 11/870,550

(22) Filed: Oct. 11, 2007

(65) Prior Publication Data

US 2008/0290341 A1 Nov. 27, 2008

(30) Foreign Application Priority Data

Oct. 12, 2006 (JP) .................. 2006-279131

(51) Int. Cl.
| | | |
|---|---|---|
| H01L 23/58 | (2006.01) | |
| G01R 31/3185 | (2006.01) | |
| G11C 29/02 | (2006.01) | |
| H01L 21/66 | (2006.01) | |
| H01L 23/48 | (2006.01) | |
| G11C 29/50 | (2006.01) | |

(52) U.S. Cl.
CPC ....... G01R 31/318513 (2013.01); *H01L 23/481* (2013.01); *H01L 2924/3011* (2013.01); G11C 29/02 (2013.01); G11C 29/022 (2013.01); G11C 29/025 (2013.01); H01L 22/32 (2013.01); *G11C 2029/5006* (2013.01); *H01L 2224/16145* (2013.01)
USPC .......................... 257/48; 257/E21.524; 438/18

(58) Field of Classification Search
USPC .......................................................... 257/48
See application file for complete search history.

(56) References Cited

U.S. PATENT DOCUMENTS 6,551,846 B1 * 4/2003 Furutani et al. .................. 438/17
2004/0257847 A1 * 12/2004 Matsui et al. .................... 365/63

FOREIGN PATENT DOCUMENTS

| JP | 02-099877 | 4/1990 |
| JP | 2002-289623 | 10/2002 |
| JP | 2004-327474 | 11/2004 |
| JP | 2005-191172 | 7/2005 |
| JP | 2006-13337 | 1/2006 |

* cited by examiner

*Primary Examiner* — Michelle Mandala
*Assistant Examiner* — Raj R Gupta
(74) *Attorney, Agent, or Firm* — Young & Thompson

(57) ABSTRACT

A stacked semiconductor device includes: an internal circuit; a through electrode provided to penetrate through a semiconductor substrate; a test wiring to which a predetermined potential different from a substrate potential is supplied at a time of a test; a first switch arranged between the through electrode and the internal circuit; a second switch arranged between the through electrode and the test wiring; and a control circuit that exclusively turns on the first and the second switches. Thereby, it becomes possible to perform an insulation test in a state that the through electrode and the internal circuit are cut off. Thus, even when a slight short-circuit that does not lead to a current defect occurs, the short circuit can be detected.

6 Claims, 12 Drawing Sheets

STACKED SEMICONDUCTOR DEVICE AND METHOD OF TESTING THE SAME

TECHNICAL FIELD

The present invention relates to a stacked semiconductor device and a method of testing the same, and, more particularly to a stacked semiconductor device capable of detecting a slight short-circuit defect of a through electrode provided to penetrate through a semiconductor substrate, and a method of testing the stacked semiconductor device.

BACKGROUND OF THE INVENTION

Recently, semiconductor memories represented by a DRAM (Dynamic Random Access Memory) increasingly grow in storage density, and operations thereof at high speed have been demanded. An increase in storage density is mainly achieved by downsizing of memory cells and large-sizing of a chip size. However, there are problems in that the downsizing of the memory cell has a certain physical limitation, and the large-sizing of the chip size leads to lowering of yield and prevents its high speed operations.

As a method of fundamentally solving this problem, there a have been proposed methods where a core unit in which memory cells are formed and an interface unit in which peripheral circuits for the memory cells are formed are separated into different chips (see Japanese Patent Application Laid-open Nos. 2004-327474, 2005-191172, and 2006-13337). According to these methods, a plurality of pieces of core chips can be assigned to one interface chip, and thus, it becomes possible to remarkably reduce a chip size per chip. Accordingly, these methods are expected to achieve a much larger density while maintaining a high yield.

Besides, when the core unit and the interface unit are separated into different chips, a core chip can be manufactured by a memory process and an interface chip can be manufactured by a logic process. Generally, transistors manufactured by the logic process can operate at higher speed, as compared to transistors manufactured by the memory process. Thus, when the interface chip is manufactured by the logic process, it becomes possible to operate a circuit of the interface chip unit at higher speed as compared to a conventional case. As a result, it becomes possible to achieve higher speed operations of the semiconductor memory. Further, it also becomes possible to decrease an operation voltage of the interface chip to about 1 V, and thus, a reduction in power consumption can also be implemented.

Further, as described in Japanese Patent Application Laid-open Nos. 2004-327474, 2005-191172, and 2006-13337, when a plurality of these semiconductor chips are stereoscopically stacked, it becomes possible to suppress an increase in packaging area on a printed circuit board.

In the stacked semiconductor device, the core chip and the interface chip are connected by through electrodes. The through electrode is provided to penetrate through a semiconductor substrate that configures the core chip and the interface chip, and is very small in parasitic capacitance and parasitic inductance, as compared to a bonding wire, a TAB tape, or the like. Thus, the through electrode does not lead to an increase in area in a plane direction like signals between chips, so that it greatly contributes to downsizing of the entire stacked semiconductor device.

Such a chip stacking technique is considered to be applied not only to the semiconductor memory such as the DRAM but also to an overall semiconductor device.

FIGS. 11A to 11C are process charts for explaining a method of manufacturing a stacked semiconductor device.

As shown in FIG. 11A, a plurality of through electrodes 13 having a predetermined depth are firstly formed on a main surface 11 of a semiconductor substrate 10 in which an internal circuit (not shown) formed of a transistor or the like is formed. At this stage, the through electrodes 13 do not penetrate through the semiconductor substrate 10, and accordingly, does not appear on a rear surface 12 of the semiconductor substrate 10.

As shown in FIG. 11B, the rear surface 12 of the semiconductor substrate 10 is then polished until the through electrodes 13 are exposed. As a result, the through electrodes 13 appear on the both surfaces of the semiconductor substrate 10. The polishing of the semiconductor substrate 10 can be performed by each chip, or can be performed in a wafer state. Thus, a stacked semiconductor device 20 is completed. Thereafter, as shown in FIG. 11C, when a plurality of stacked semiconductor devices 20 are placed on top of each other via an interchip interconnect 14, a stacking module is formed. It then becomes possible to be packaged on a mounting substrate 30 such as the interface chip or the like.

FIG. 12 is a partial schematic cross-section of the semiconductor substrate 10 shown in FIG. 11A, before being polished.

As shown in FIG. 12, between the through electrode 13 and the semiconductor substrate 10, an insulating film 15 for insulating the both components is arranged. However, due to certain reasons, an insulation breakdown can sometimes occur in the insulating film 15, and in this case, the through electrode 13 and the semiconductor substrate 10 are in a short-circuited state (see a defective portion A). Further, above the through electrode 13, wirings 16a and 16b or the like are arranged. These components are connected by contacts 17a and 17b. However, when displacement occurs to the contact 17a for connecting the wiring 16a and the through electrode 13, the through electrode 13 and the semiconductor substrate 10 are in a short-circuited state (see a defective portion B).

Most of such short-circuit defects lead to a current defect and an operation defect. Thus, these defects are found in a selective test performed in a wafer state, and treated as a defective chip. However, there are various states of the defective portions, and thus, not all the short-circuit defects can be found in the selective test performed in a wafer state. That is, in a complete short-circuited state, a relatively large amount of current passes between the through electrode 13 and the semiconductor substrate 10, and thus, the short-circuit defects are easily found as the current defect or the operation defect in the selective test. However, as far as a defect in a slight short-circuited state does not cause the current defect or the operation defect, the chip may pass the selective test. Although such a slight short-circuit defect poses no problem as far as a single chip is concerned, there is a possibility that the operation defect is caused after a plurality of chips are stacked. Thus, there is a case that such a defect can be a reason for deteriorating a product yield after a stacking process.

SUMMARY OF THE INVENTION

The present invention has been achieved to solve such problems, and an object of the present invention is to provide a stacked semiconductor device capable of correctly finding a short-circuit defect of a through electrode and a method of testing the stacked semiconductor device.

A stacked semiconductor device according to the present invention, comprising:

an internal circuit formed on a semiconductor substrate;

at least one through electrode provided to penetrate through the semiconductor substrate;

a test wiring to which a predetermined potential different from a substrate potential is supplied at a time of a test;

a first switch arranged between the at least one through electrode and the internal circuit;

a second switch arranged between the at lease one through electrode and the test wiring; and a control circuit that exclusively turns on the first and the second switches.

A testing method of a stacked semiconductor device according to the present invention including an internal circuit formed on a semiconductor substrate and a through electrode provided to penetrate through the semiconductor substrate, the method of a stacked semiconductor device comprising:

a first step for supplying a predetermined potential different from a substrate potential to the through electrode, in a state that the through electrode and the internal circuit are cut off; and a second step of determining whether a current passes through the through electrode.

According to the present invention, it is possible to perform an insulation test in a state where the through electrode and the internal circuit are cut off, and thus, even when a slight short-circuit defect that does not lead to a current defect occurs, the short-circuit defect can be detected. That is, it becomes possible to eliminate a chip before it is stacked, i.e., a chip which is determined that no current defect nor operation defect is caused in a conventional selective test but which is considered to have a possibility to cause the operation defect after the chips are stacked can be eliminated. In some stacked semiconductor device, there is a case that the number of chips to be stacked is not determined yet in a wafer stage, and thus, the operation defect is caused or not caused depending on the number of chips to be stacked. According to the present invention, such uncertain elements can be eliminated, thereby surely enhancing the product yield after the chips are stacked.

In addition, when the current defect is detected in a normal selective test, if the test of the present invention is further executed, it becomes possible to specify whether the current defect is caused due to the internal circuit, or to the through electrode. This configuration remarkably helps solving the problems in the manufacturing process.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
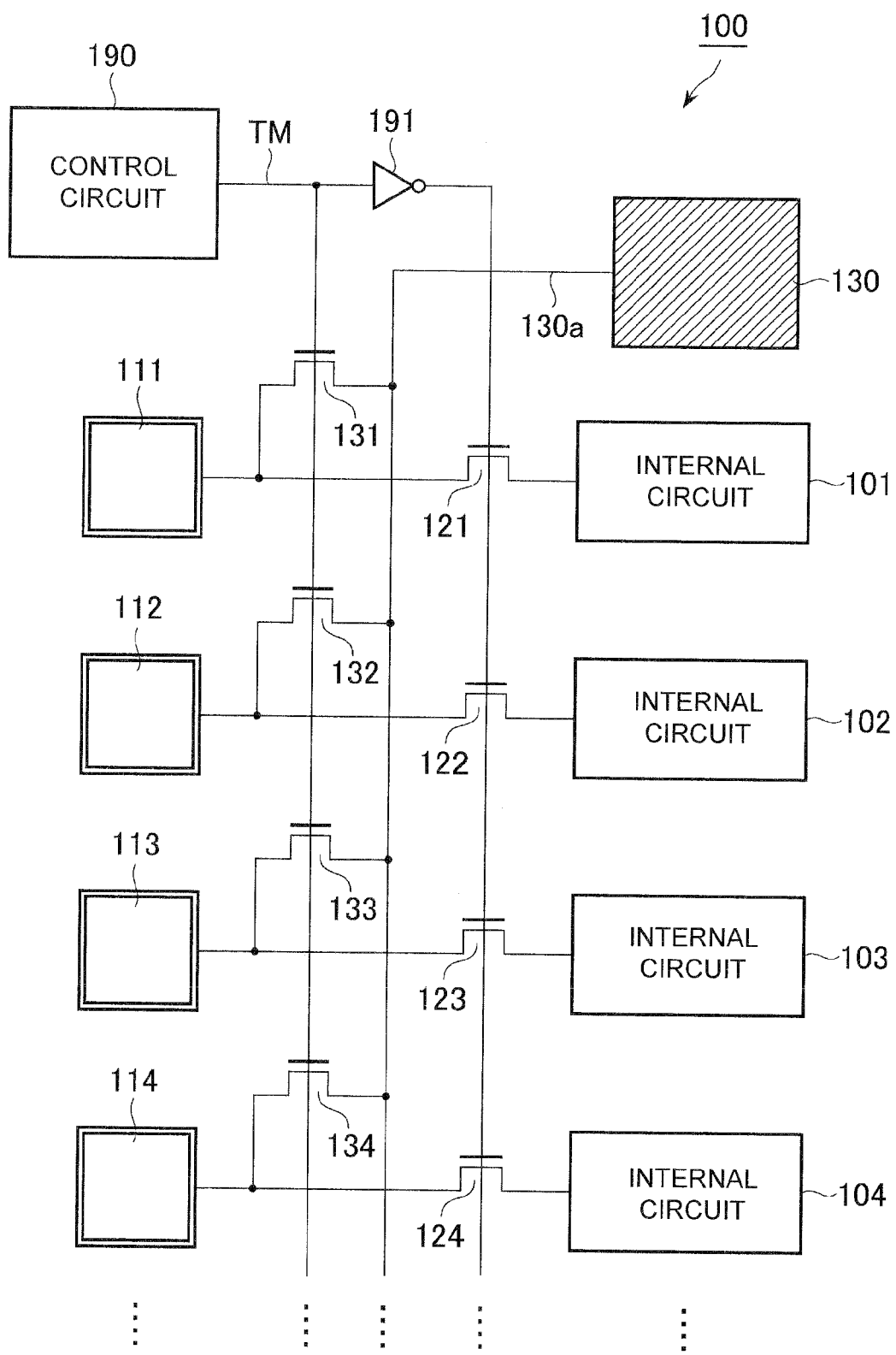
FIG. 1 is a circuit diagram showing a configuration of main parts of a stacked semiconductor device according to a first embodiment of the present invention.
Figure 11A:
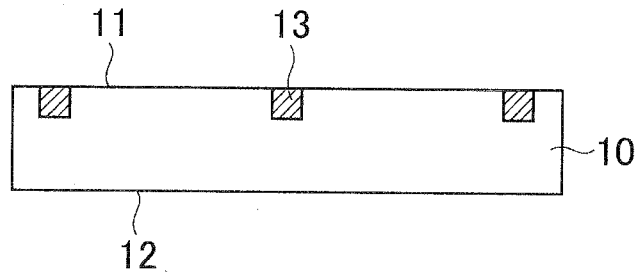
FIGS. 11A to 11C are process charts for explaining a method of manufacturing a stacked semiconductor device.
Figure 11B:
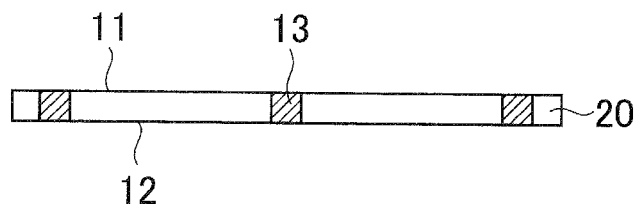
Figure 11C:
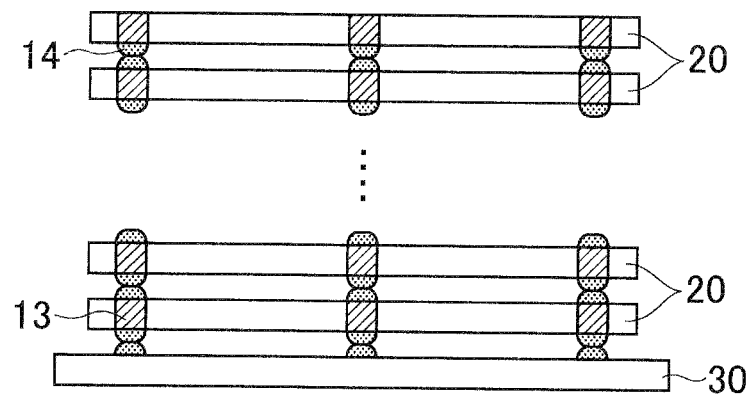
Figure 12:
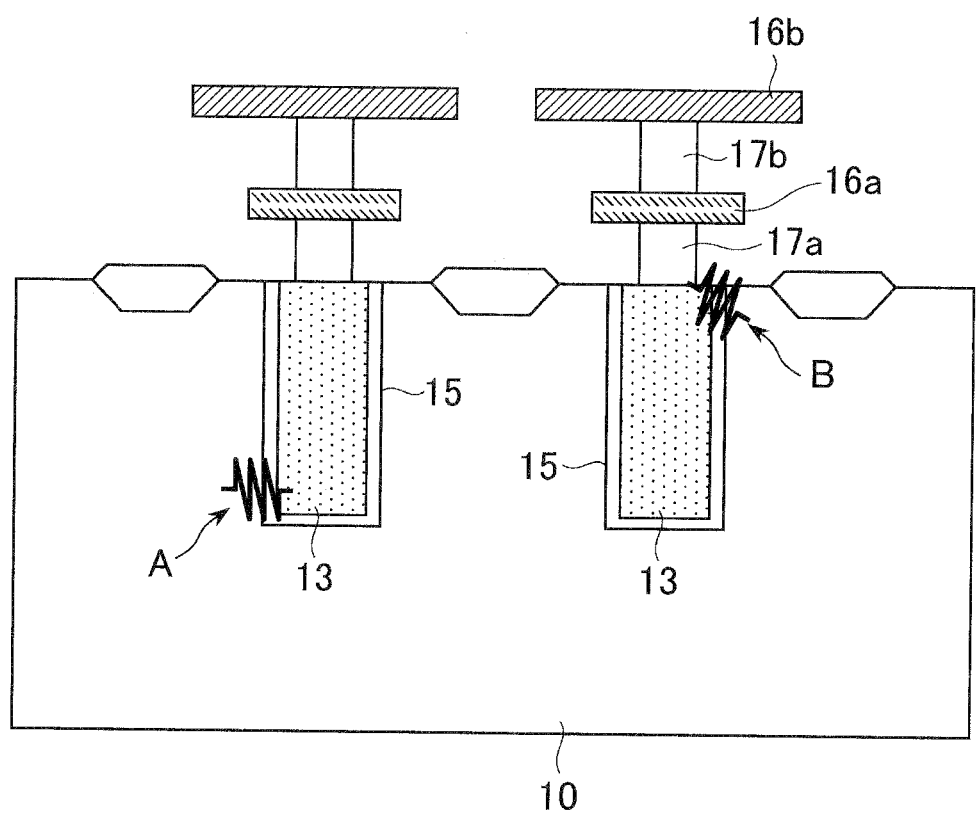
FIG. 12 is a partial schematic cross-section of the semiconductor substrate shown in FIG. 11A, before being polished.

FIG. 1 is a circuit diagram showing a configuration of main parts of a stacked semiconductor device 100 according to the first embodiment of the present invention. A basic structure of the stacked semiconductor device 100 is similar to that of a general stacked semiconductor device, and is manufactured by the method shown in FIGS. 11A to 11C, for example.

As shown in FIG. 1, the stacked semiconductor device 100 includes: internal circuits 101, 102, 103, 104, . . . ; through electrodes 111, 112, 113, 114, . . . , which correspond to the internal circuits, respectively; switches 121, 122, 123, 124, . . . , each arranged between the corresponding through electrodes and internal circuits; and switches 131, 132, 133, 134, . . . , each arranged between the corresponding through electrodes and a measuring pad 130.

The internal circuits 101, 102, 103, 104, . . . , are configured by a transistor or the like formed on a main surface of a semiconductor substrate. Accordingly, when the stacked semiconductor device 100 is a DRAM, the internal circuit corresponds to a DRAM core, for example. The through electrodes 111, 112, 113, 114, . . . , are provided to penetrate through the semiconductor substrate, and in this case, the through electrode corresponds to a signal electrode for inputting and outputting a signal. The reason for limiting the through electrode, which is a subject to test in the present embodiment, to the signal electrode is that power supply is needed also when the test is performed and a test of a power supply electrode is difficult.

As shown in FIG. 1, the switches 121, 122, 123, 124, . . . , and the switches 131, 132, 133, 134, . . . , are configured by n-channel MOS transistors. However, it is not required that these switches be formed of the n-channel MOS transistor. The switches can be configured by using other elements, and the switches can be configured by using a circuit formed of a plurality of elements.

In the present embodiment, gates of the switches 131, 132, 133, 134, . . . , are commonly supplied a test mode signal TM. On the other hand, gates of the switches 121, 122, 123, 124, . . . , are commonly supplied a signal that is obtained by inverting the test mode signal TM by an inverter 191. As a result, the switches 121, 122, 123, 124, . . . , and switches 131, 132, 133, 134, . . . , are exclusively turned on based on a logical level of the test mode signal TM.

A control circuit 190 that generates the test mode signal TM renders active the test mode signal TM to a high level when the test is performed, and renders inactive the test mode signal TM to a low level at a normal time. Although not particularly limited, a mode register or the like can be used for the control circuit 190. In this case, a command of a mode register set is issued from outside, and a predetermined mode signal is set to a mode register, and thereby, the test mode signal TM can be rendered active.

A testing method of the stacked semiconductor device 100 is described next. Although not particularly limited, the testing method of the stacked semiconductor device 100 is preferably performed in a wafer state.

Figure 2:
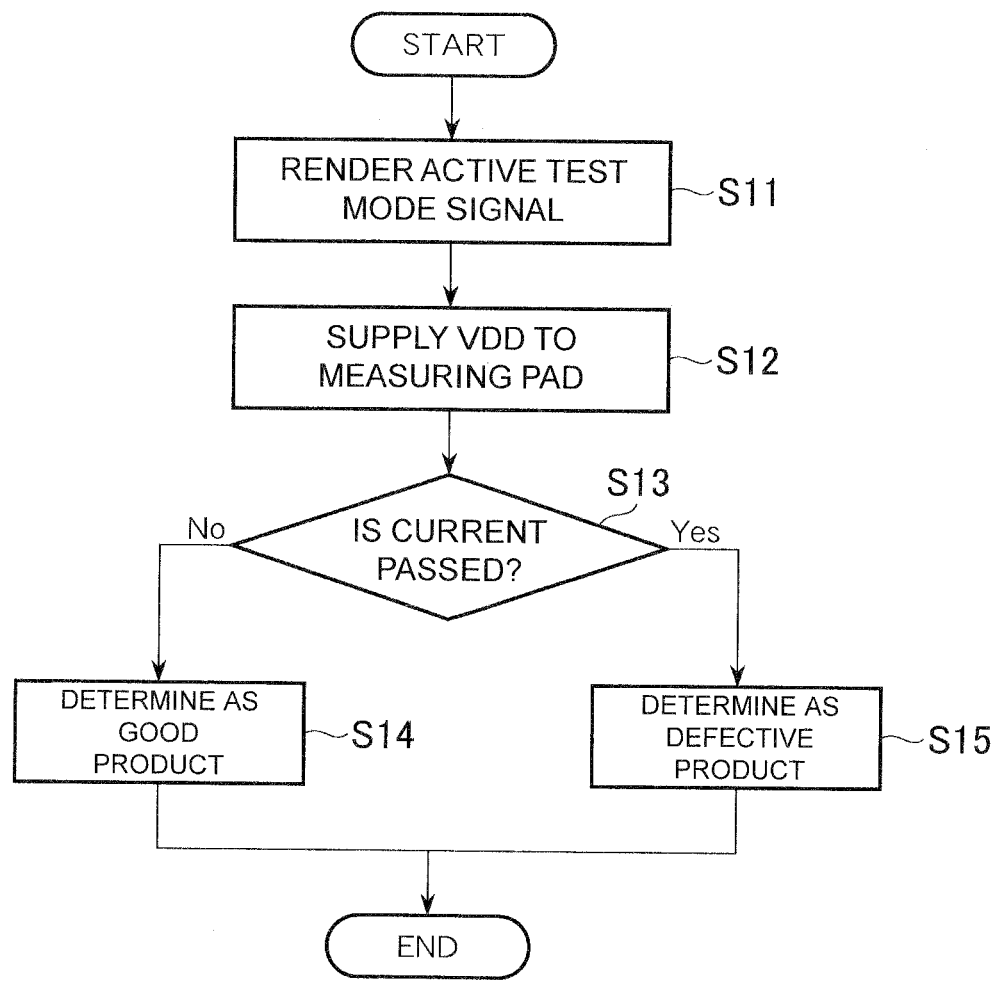
FIG. 2 is a flowchart for explaining a testing method of the stacked semiconductor device shown in FIG. 1.

FIG. 2 is a flowchart for explaining the testing method of the stacked semiconductor device 100.

As shown in FIG. 2, the test mode signal TM is firstly rendered active to a high level by the control circuit 190 (step S11). As described above, such an operation can be performed by the mode register set. Thereby, all the switches 121, 122, 123, 124, . . . , are brought to an off state. As a result, the through electrodes and the internal circuits are in a cut-off state, and at the same time, all the switches 131, 132, 133, 134, . . . , are brought to an on state. As a result, each through electrode is commonly connected via a test wiring 130a to the measuring pad 130.

As described above, all the through electrodes 111, 112, 113, 114, . . . , which are subject to the test, are signal electrodes, and thus, if there is no short-circuit defect, the through electrodes should be insulated from the semiconductor substrate. That is, if there is no short-circuit defect, the measuring pad 130 should be in a floating state.

Next, a predetermined potential different from a substrate potential, for example a power supply potential (VDD), is supplied to the measuring pad 130 (step S12). Such an operation can be performed by contacting a probe of an external tester to the measuring pad 130. As described above, the through electrodes 111, 112, 113, 114, . . . , should be insulated from the semiconductor substrate, and thus, if there is no short-circuit defect, no current should pass.

Subsequently, it is determined whether a current passes through the through electrodes 111, 112, 113, 114, . . . , (step S13). It is determined as a good product when no current substantially passes (step S14), and it is determined as a defective product when a current substantially passes (step S15). That is, when the current passes via the measuring pad 130, this means that a short-circuit defect occurs between any one of the through electrodes 111, 112, 113, 114, . . . , and the semiconductor substrate. Thus, even when the product passes a conventional current test, the operation defect is probably caused after the chips are stacked. Accordingly, at this stage, this product is treated as defective. Whether to determine as a defective product based on an amount of current that pass can be appropriately established by considering an operation defect or the like estimated to occur after the chips are stacked.

Thus, in the stacked semiconductor device 100, when the test mode signal TM is rendered active, connections of the through electrodes 111, 112, 113, 114, . . . , to the internal circuits 101, 102, 103, 104, . . . , can be switched to the measuring pad 130. Thus, when the probe of the tester is contacted to the measuring pad 130, it becomes possible to correctly find the short-circuit defects of the through electrodes 111, 112, 113, 114, . . . . At a normal operation time, the switches 121, 122, 123, 124, . . . , are turned on, and the switches 131, 132, 133, 134, . . . , are turned off. Thus, operations of the internal circuits 101, 102, 103, 104, . . . , are not influenced at all.

The second embodiment of the present invention is described next.

Figure 3:
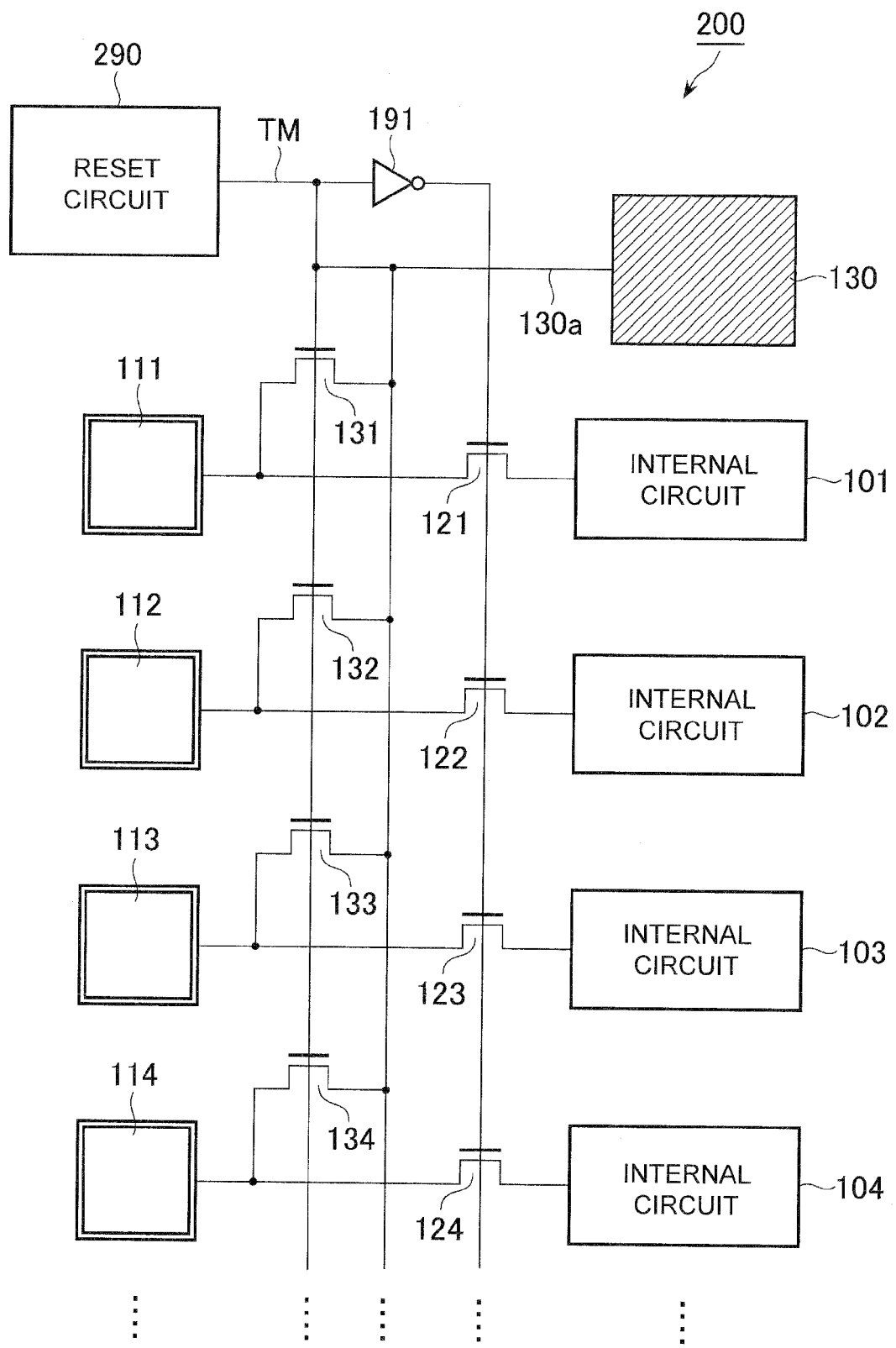
FIG. 3 is a circuit diagram showing a configuration of main parts of a stacked semiconductor device according to a second embodiment of the preset invention.

FIG. 3 is a circuit diagram showing a configuration of main parts of a stacked semiconductor device 200 according to the second embodiment of the preset invention.

As shown in FIG. 3, the stacked semiconductor device 200 differs from the stacked semiconductor device 100 in that the test wiring 130a is connected to the gates of the switches 131, 132, 133, 134, . . . , and an input terminal of the inverter 191, and the control circuit 190 is replaced by a reset circuit 290. Since other features of the configuration of the stacked semiconductor device 200 are identical to those of the stacked semiconductor device 100, like parts are designated by like reference numerals, and redundant explanations thereof will be omitted.

Unlike the control circuit 190 shown in FIG. 1, the reset circuit 290 does not have a function for rendering active the test mode signal TM. The reset circuit 290 merely has a function for keeping the test mode signal TM in an inactive state at the time of the normal operation.

As shown in FIG. 3, in the present embodiment, the potential supplied to the measuring pad 130 is directly used as the test mode signal TM. Accordingly, a circuit portion that supplies the logical level of the measuring pad 130 to the gates of the switches 131, 132, 133, 134, . . . , and a circuit portion that supplies an inverted level of the measuring pad 130 to the gates of the switches 121, 122, 123, 124, . . . , configure the "control circuit" referred to in the present invention.

Figure 4:
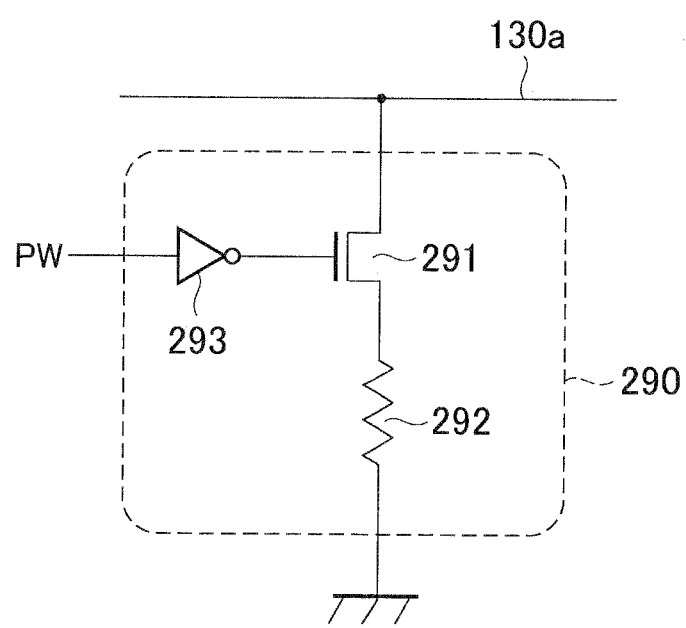
FIG. 4 is a circuit diagram showing one example of the reset circuit.

FIG. 4 is a circuit diagram showing one example of the reset circuit 290.

In an example shown in FIG. 4, the reset circuit 290 is configured by a transistor 291 and a resistance 292 connected in series between the test wiring 130a and a ground potential, and an inverter 293 that supplies the inverted level of a PW mode signal to a gate of the transistor 291. The PW mode signal is a signal that selects whether as a signal supply path, to use a through electrode or a pad electrode. Thus, inherently, the PW mode signal is not directly related to the present invention. However, in view of the fact that the PW mode signal is fixed to a low level after the chips are stacked and fixed to a high level at the time of the test, the PW mode signal is used. Accordingly, instead of the PW mode signal, another signal having a similar logical level can be used.

Figure 5:
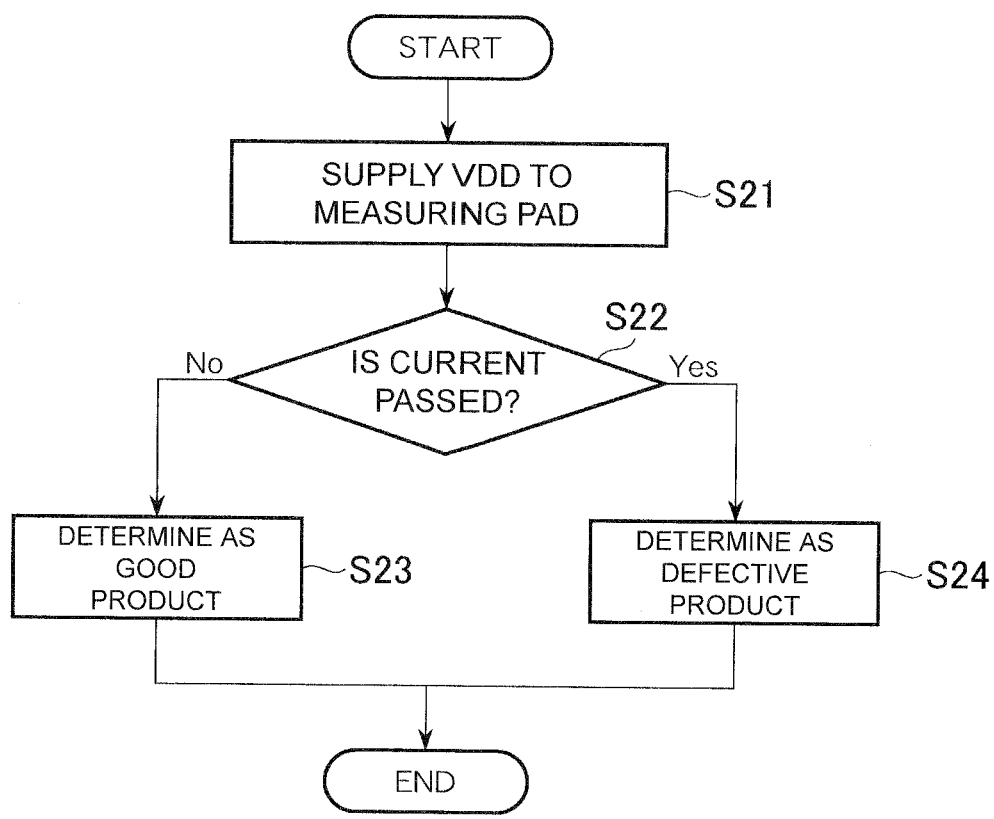
FIG. 5 is a flowchart for explaining a testing method of the stacked semiconductor device shown in FIG. 3.

FIG. 5 is a flowchart for explaining a testing method of the stacked semiconductor device 200.

As shown in FIG. 5, the probe of the tester is contacted to the measuring pad 130 to supply a predetermined potential different from the substrate potential, that is, a power supply potential (VDD), for example, to the measuring pad 130 (step S21). At this time, the PW mode signal is at a high level, and thus, the reset circuit 290 is in a high impedance state. On the other hand, the potential supplied to the measuring pad 130 directly leads to the test mode signal TM, and thus, all the switches 121, 122, 123, 124, . . . , are brought to an off state, and the through electrodes and the internal circuits are cut off. At the same time, all the switches 131, 132, 133, 134, . . . , are brought to an on state, and as a result, each through electrode is commonly connected via the test wiring 130a to the measuring pad 130.

In this state, it is determined whether a current passes through the through electrodes 111, 112, 113, 114, . . . , (step S22). When substantially no current passes, this chip is determined as a good product (step S23), and when the current substantially passes, this chip is determined as a defective product (step S24).

Thus, in the stacked semiconductor device 200, in addition to the effect of the stacked semiconductor device 100, the potential of the measuring pad 130 is directly used as the test mode signal TM. Thus, there is no need of starting a dedicated test mode inside the device. When the chips pass the test and after the chips are actually stacked, the PW mode signal is fixed to a low level. Thus, by the function of the reset circuit 290, the test mode signal TM is fixed to a low level. Thus, after the chips are stacked, the switches 121, 122, 123, 124, ..., are always kept to the on state, and the switches 131, 132, 133, 134, ..., are always kept to the off state. Accordingly, conductive states of these switches are not inverted at the time of an actual use.

A specific configuration of the reset circuit 290 is not limited to that shown in FIG. 4. Any circuit can be used, in which substantially no influence is exerted on the test wiring 130a at the time of the test, and the test mode signal TM can be kept to the inactive level in the normal state after the chips are stacked.

The third embodiment of the present invention is described next.

Figure 6:
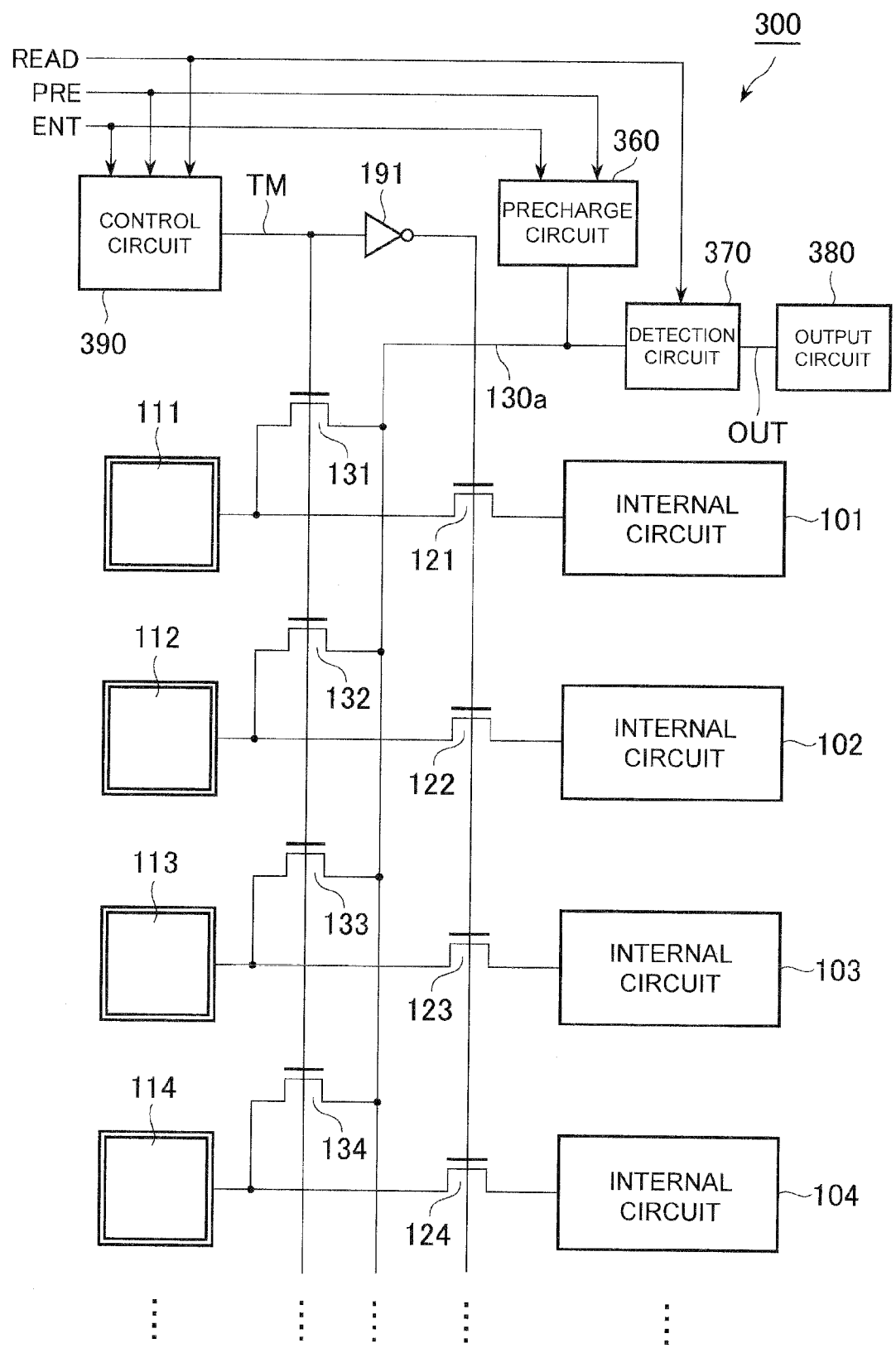
FIG. 6 is a circuit diagram showing a configuration of main parts of a stacked semiconductor device according to a third embodiment of the preset invention.

FIG. 6 is a circuit diagram showing a configuration of main parts of a stacked semiconductor device 300 according to the third embodiment of the preset invention.

The stacked semiconductor device 300 differs from the stacked semiconductor device 100 in that the control circuit 190 is replaced by a control circuit 390, and instead of the measuring pad 130, a precharge circuit 360, a detection circuit 370, and an output circuit 380 are arranged. Since other features of the stacked semiconductor device 300 are identical to those of the stacked semiconductor device 100, like parts are designated by like reference numerals, and redundant explanations thereof will be omitted.

Unlike in the first and second embodiments in which the test is performed by contacting the probe from outside, in the third embodiment, the stacked semiconductor device 300 is configured to be self-diagnosable. Accordingly, the measuring pad 130 is not arranged, and instead thereof, three internal signals, i.e., a read signal READ, a precharge signal PRE, and a test mode entry signal ENT, are used.

Figure 7:
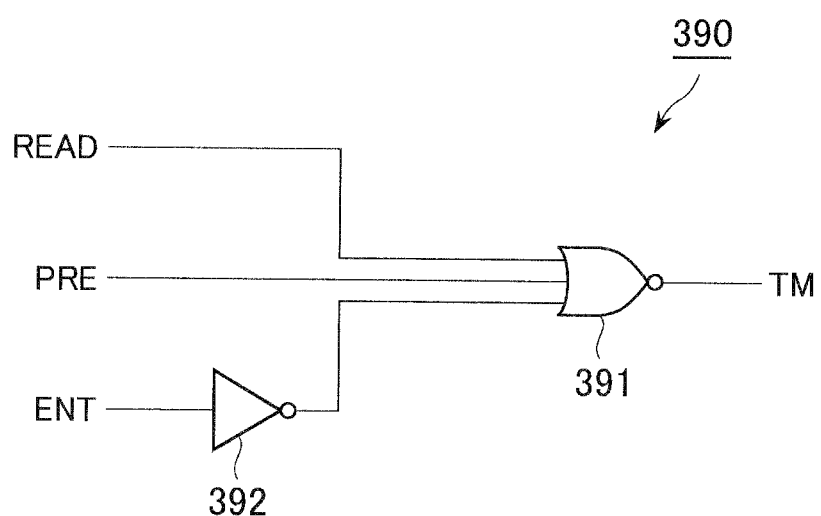
FIG. 7 is a circuit diagram of the control circuit.

FIG. 7 is a circuit diagram of the control circuit 390.

As shown in FIG. 7, the control circuit 390 is configured by: a 3-input NOR circuit 391 that receives the read signal READ, the precharge signal PRE, and an inverted signal of the test mode entry signal ENT; and an inverter 392 that inverts the test mode entry signal ENT. With this configuration, when the read signal READ and the precharge signal PRE are at a low level and the test mode entry signal ENT is at a high level, the test mode signal TM, which is output, is rendered active to a high level.

Figure 8:
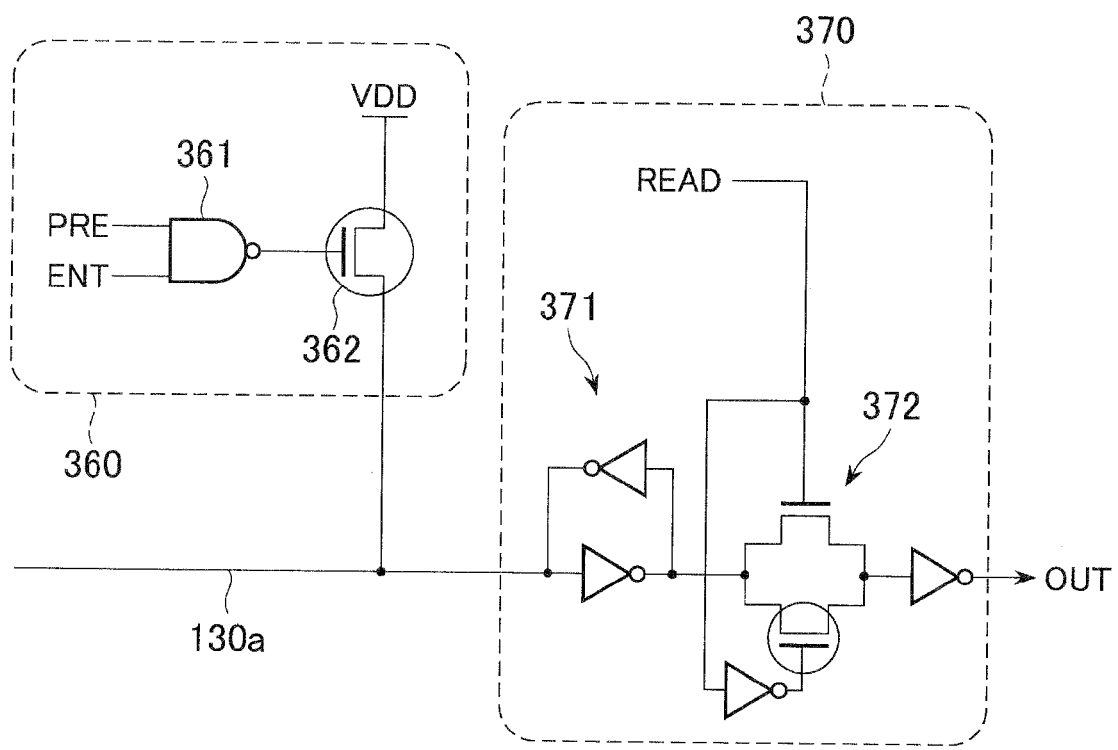
FIG. 8 is a circuit diagram of the precharge circuit and the detection circuit.

FIG. 8 is a circuit diagram of the precharge circuit 360 and the detection circuit 370.

The precharge circuit 360 serves to precharge the test wiring 130a, and is configured by a NAND circuit 361 that receives the precharge signal PRE and the test mode entry signal ENT and a p-channel MOS transistor 362 connected between the power supply potential VDD and the test wiring 130a, as shown in FIG. 8. A gate of the transistor 362 is supplied output of the NAND circuit 361. With this configuration, when the precharge signal PRE and the test mode entry signal ENT are at a high level, the test wiring 130a is precharged to the power supply potential.

On the other hand, the detection circuit 370 detects the potential of the test wiring 130a, and is configured by a latch unit 371 connected to the test wiring 130a and a transfer gate 372 arranged after the latch unit 371. The transfer gate 372 is turned on when the read signal READ is at a high level, and supplies a content of the latch unit 371, as a detection signal OUT, to an output circuit 380.

The output circuit 380 outputs the detection signal OUT to outside, and its description is omitted.

An operation of the stacked semiconductor device 300 is described next.

Figure 9:
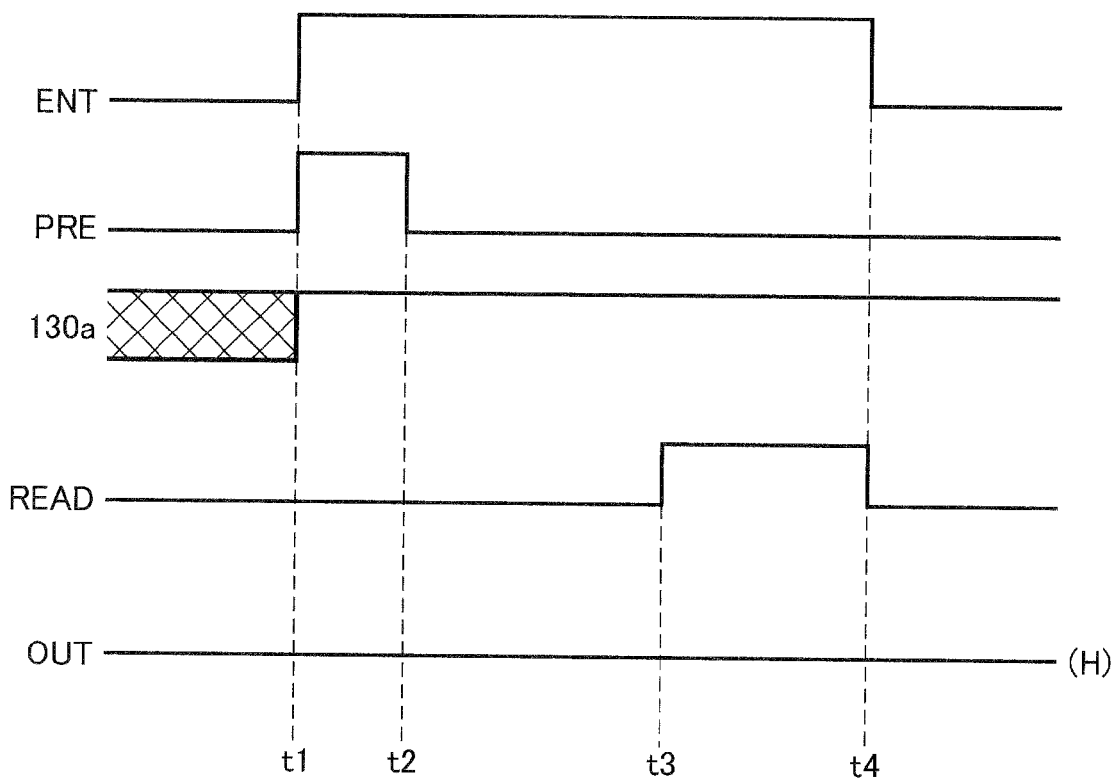
FIG. 9 is a timing chart for explaining the operation of the stacked semiconductor device shown in FIG. 6, in the case where there is no short-circuit defect.
Figure 10:
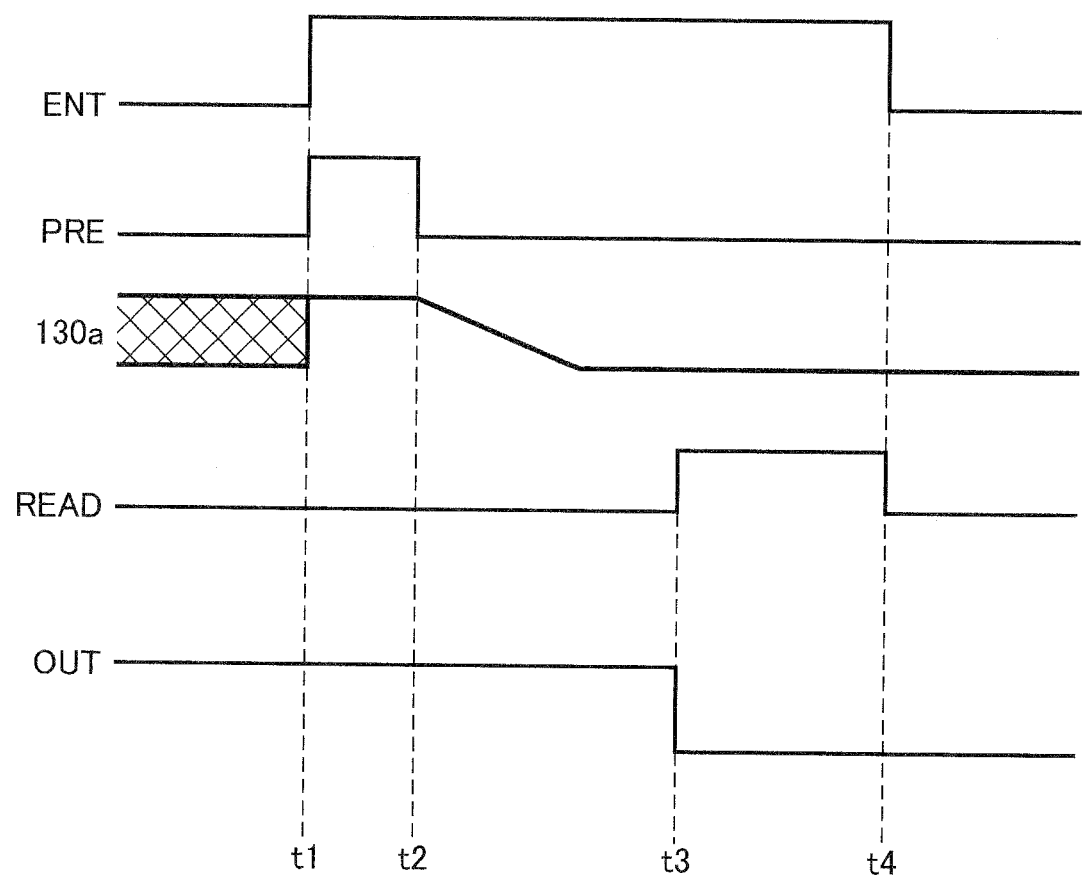
FIG. 10 is a timing chart for explaining the operation of the stacked semiconductor device shown in FIG. 6, in the case where there is a short-circuit defect.

FIGS. 9 and 10 are timing charts for explaining the operation of the stacked semiconductor device 300. FIG. 9 shows a case when there is no short-circuit defect, and FIG. 10 shows a case when there is a short-circuit defect, respectively.

In a state before a time t1, all of the read signal READ, the precharge signal PRE, and the test mode entry signal ENT are fixed to a low level. Thereby, the test mode signal TM is brought to a low level. Thus, the switches 121, 122, 123, 124, ..., are turned on, and the switches 131, 132, 133, 134, ..., are turned off. That is, a normal connection state is established.

Subsequently, at the time t1, the precharge signal PRE and the test mode entry signal ENT are changed to a high level. Thereby, the transistor 362 included in the precharge circuit 360 is turned on, and thus, the power supply potential is supplied to the test wiring 130a. At this time, the switches 131, 132, 133, 134, ..., are kept to the off state. Thus, the test wiring 130a is in a state of being precharged to the power supply potential.

Thereafter, when the precharge signal PRE is changed to a low level at a time t2, the precharge circuit 360 is changed from an active state to an inactive state, and then, a precharge operation is ended. At the same time, by an operation of the control circuit 390, the test mode signal TM is rendered active to a high level. Thereby, the switches 131, 132, 133, 134, ..., are turned on, and the test wiring 130a and the through electrodes 111, 112, 113, 114, are brought into a commonly connected state.

Even when this state is kept for a while and there is no short-circuit defect in the through electrodes 111, 112, 113, 114, ..., a level of the test wiring 130a does not substantially change, as shown in FIG. 9. As a result, a high level is latched to the latch unit 371 included in the detection circuit 370. In contrary, when there is the short-circuit defect in the through electrodes 111, 112, 113, 114, ..., and if this state is kept for a while, the level of the test wiring 130a gradually drops due to a leak, as shown in FIG. 10, and the level finally drops to a ground level, which is the substrate potential. As a result, a low level is latched to the latch unit 371 included in the detection circuit 370.

Thereafter, when the read signal READ is changed to a high level at a time t3, the transfer gate 372 is turned on to render active the detection circuit. Thereby, when there is no short-circuit defect, the detection signal OUT is brought to a high level, as shown in FIG. 9. When there is the short-circuit defect, the detection signal OUT is brought to a low level, as shown in FIG. 10. The detection signal OUT thus obtained is supplied to the output circuit 380 shown in FIG. 6, and read out to outside.

Thereafter, when the test mode entry signal ENT and the read signal READ are changed to a low level at a time t4, the state before the time t1 is restored.

Thus, the stacked semiconductor device 300 is not configured to perform the test by contacting the probe from outside, but configured to be self-diagnosable. Thus, there is no need to arrange a measuring pad, and accordingly it becomes possible to reduce a chip area.

The present invention is in no way limited to the aforementioned embodiments, but rather various modifications are possible within the scope of the invention as recited in the claims, and naturally these modifications are included within the scope of the invention.

For example, in the above embodiments, by rendering active the test mode signal TM, a plurality of through electrode 111, 112, 113, 114, ..., are simultaneously tested.

However, the number of through electrodes to be simultaneously tested is not particularly limited. It can be configured such that all signal electrodes can be simultaneously tested, or the signal electrodes can be divided into various groups to test the signal electrodes by each group. Further, it can be configured that a plurality of signal electrodes are not simultaneously tested, but the test is performed for each one of signal electrodes.

While the through electrode which is subject to test is limited to the signal electrode in the above embodiments, when a power supply block necessary for the test operation is made independent, it is possible to perform a test similar to those in the above embodiments on a power supply terminal other than the power supply block.

What is claimed is:

1. A semiconductor device, comprising:
   first, second and third internal circuits each formed in a semiconductor substrate;
   first, second and third through electrodes each formed to penetrate the semiconductor substrate;
   a wiring supplied with a test voltage in a test mode;
   a first switch connected between the first internal circuit and the first through electrode;
   a second switch connected between the second internal circuit and the second through electrode;
   a third switch connected between the third internal circuit and the third through electrode; and
   fourth, fifth and sixth switches each having first and second terminals, the first terminals of the fourth, fifth and sixth switches being connected in common to the wiring, and the second terminals of the fourth, fifth and sixth switches being connected respectively to the first, second and third through electrodes;
   each of the first, second and third switches being rendered nonconductive in the test mode and of fourth, fifth and sixth switches being rendered conductive in the test mode to supply the test voltage respectively to the first, second and third through electrodes.

2. The device as claimed in claim 1, wherein each of the first, second and third switches being rendered conductive in a normal mode and each of the fourth, fifth and sixth switches being rendered nonconductive in the normal mode.

3. The device as claimed in claim 1, wherein each of the first, second and third switches is rendered nonconductive by the test voltage and each of the fourth, fifth and sixth switches is rendered conductive by the test voltage.

4. The device as claimed in claim 1, wherein the wiring is connected to a measuring pad to receive the test voltage.

5. The device as claimed in claim 1, further comprising a precharge circuit formed in the semiconductor substrate and connected to the wiring, the precharge circuit being activated to precharge the wiring to the test voltage, and each of the first, second and third switches being rendered nonconductive and each of the fourth, fifth and sixth switches being rendered conductive after the wiring has been precharged to the test voltage.

6. The device as claimed in claim 5, further comprising a detection circuit connected to the wiring to detect a potential on the wiring.

* * * * *